United States Patent [19]

Mok et al.

[11] Patent Number: 5,438,439

[45] Date of Patent: Aug. 1, 1995

[54] NON-DESTRUCTIVE READOUT MECHANISM FOR VOLUME HOLOGRAMS USING TWO WAVELENGTHS

[76] Inventors: Fai Mok, 4636 Talisman St., Torrance, Calif. 90503; Demetri Psaltis, 1075 Mesita Rd., Pasadena, Calif. 91107; Hsin-Yu S. Li, 1052 E. Del Mar Blvd Apt. 3, Pasadena, Calif. 91106

[21] Appl. No.: 106,288

[22] Filed: Aug. 13, 1993

[51] Int. Cl.$^6$ .............................................. G03H 1/02
[52] U.S. Cl. ........................................ 359/10; 359/11; 359/25
[58] Field of Search ........................ 359/1-5, 359/10, 11, 22, 25, 24, 9, 26; 365/216; 369/103; 382/31

[56] References Cited

U.S. PATENT DOCUMENTS 3,767,285  10/1973  Mezrich ................................ 359/25
5,121,231  6/1992  Jenkins et al. ......................... 359/10

*Primary Examiner*—Davis L. Willis
*Assistant Examiner*—Robert Kim
*Attorney, Agent, or Firm*—Fish & Richardson

[57] ABSTRACT

Multiple volume holograms are recorded by changing the incidence angle of the reference beam at one wavelength. The stored holograms are reconstructed at another wavelength by using the reference beam oriented at the proper incidence angle. The proper holographic data are retrieved by pre-formatting or post-formatting the holographic data to be recorded or reconstructed. This usage of using different wavelengths for recording and reconstruction are independent of the scanning mechanisms for the reference beam. Utilization of holographic memories for storage and retrieval of data, and correlations can make use of this invention.

8 Claims, 15 Drawing Sheets

NON-DESTRUCTIVE READOUT MECHANISM FOR VOLUME HOLOGRAMS USING TWO WAVELENGTHS

BACKGROUND—FIELD OF INVENTION

This invention relates to volume holography, specifically to a readout mechanism that will not erase the recorded information.

BACKGROUND—DISCUSSION OF PRIOR ART

Volume holographic storage has high storage density due to 3-dimensional storage and high readout rate due to parallel retrieval [reference: Demetri Psaltis, "Parallel Optical Memories", *Byte*, 17(9), 179–182 (1992)]. The practical development of such memories has been impeded by lack of materials that have all the suitable properties. Specifically, a very difficult requirement to satisfy is the simultaneous need for materials that are very sensitive to light in order to increase the recording speed, and the need for a, non-volatile storage device or memory that does is affected by illumination to light during readout. Thermal fixing [D. L. Staebler, et al., "Multiple Storage and Erasure of Fixed Holograms in Fe-Doped Lithium Niobate", *Appl. Phys. Lett.*, 26(4), 182–184 (1975)] and electrical fixing IF. Micheron and G. Bismuth, "Electrical control of fixation and erasure of holographic patterns in ferroelectric materials," *Appl. Phys. Left.*, 20(2), 79–81 (1972)] are solutions that have been demonstrated to address this problem. Thermal fixing is the most commonly used method, but its inconvenience makes it difficult to design practical systems. Moreover, thermal fixing is incompatible with a practical reprogrammable memory because holograms that are fixed cannot be erased optically. Electrical fixing, in principle, is more compatible with a practical reprogrammable memory, however electrical fixing is still not well developed.

In principle, using a wavelength that has little or no effect on the recording medium for readout will solve the volatility problem while maintaining the programmability of the memory. In fact, dual wavelength schemes have been employed to implement various optical systems. One such system was demonstrated by McRuer, et al., [McRuer, et al., "Two-wavelength photorefractive dynamic optical interconnect," *Opt. Lett.*, 14(21), 1174–1176 (1989)] for a nonvolatile optical interconnections with a, photorefractive crystal. Another example involves the construction of a deflector utilizing a dual wavelength method [Pauliat, et al., "Dynamic beam deflection using photorefractive gratings in $Bi_{12}SiO_{20}$ crystals," *J. Opt. Soc. Am. B*, 3(2), 306–313 (1986)]. So far, the closest that anyone has come to solving the volatility problem using a dual wavelength scheme involves readout of a single hologram using spherical waves [H.-C. Külich, "Reconstructing volume holograms without image field losses," *App. Opt.*, 30(20), 2850–2857 (1991)]. Such reconstructions, however, are not light efficient and the reconstructed images are distorted. In addition, the sphericity of the readout beam has to vary as different holograms are reconstructed. In other words, complex optics are needed.

OBJECTS AND ADVANTAGES

Accordingly, several objects and advantages of our invention are:

1. to allow non-destructive readout of holograms;
2. to allow usage of simple readout optics;
3. to provide efficient reconstructions;
4. to provide relatively undistorted reconstructions; and
5. to permit optical and selective erasure of holograms.

In the special case of reconstructing holograms at red or infrared wavelengths, an additional object and advantage of our invention is that rugged, inexpensive and efficient laser diodes can be used as the light sources. Still further objects and advantages will become apparent from a consideration of the ensuing description and drawings.

SUMMARY

Figure 1:
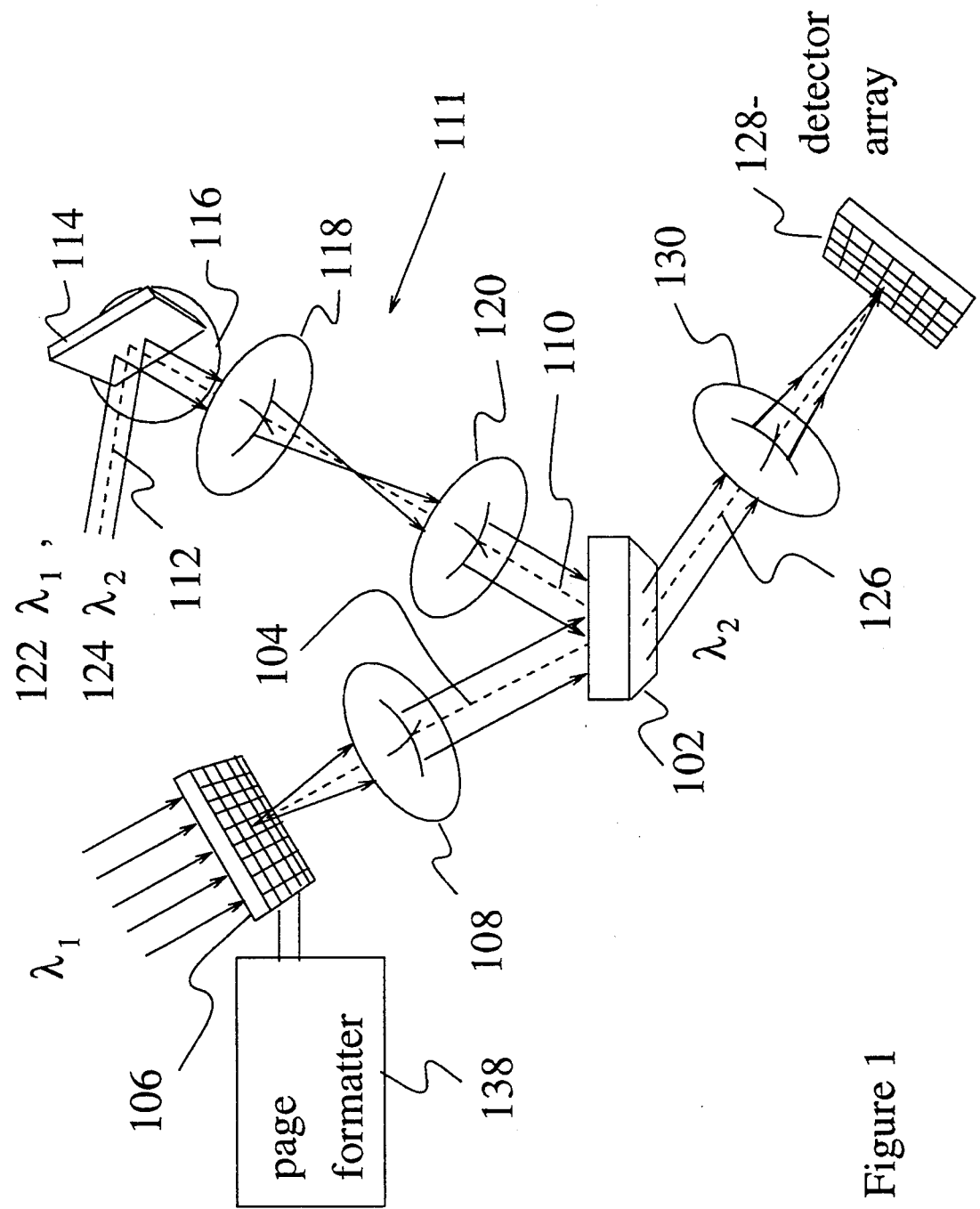
FIG. 1 shows the preferred embodiment for the invention.

Non-destructive readout of volume holographic memories is accomplished by using different wavelengths in the recording and readout phases. Multiple volume holograms are multiplexed within a volume of photosensitive medium. Using a wavelength that has no physical or chemical effect on the recording medium. Holograms are reconstructed but not erased. Holograms, however, have to be pre-formatted to produce reconstructions of desirable formats. Alternatively, reconstructions can be post-formatted to produce desirable results. Pre- or post-formatting can be avoided if fragments of recorded holograms are reconstructed.

Three embodiments of the invention are described. The first one is the most preferred one and presents a basic version of the invention. Embodiments II and III cover applications that incorporate embodiment I. Embodiment II describes a generic many-location holographic memory that makes use of the invention. Embodiment III narrows embodiment II by specifying the shape of the recording medium—a 3-dimensional disk.

In general, this invention applies to readouts of multiple volume holograms that needs one wavelength for recording and a different wavelength for readout.

DESCRIPTION OF THE INVENTION

Preferred embodiment I

FIG. 1A shows a perspective view of preferred embodiment I of the present invention. A 3-dimensional photosensitive medium 102, such as a photorefractive crystal, is the holographic storage medium.

Two light beams provide the energy to record holograms. One of the light beams, image beam 104, is a coherent light beam spatially modulated by a 1-dimensional or a 2-dimensional display, or a spatial light modulator 106. A Fourier transform lens 108 puts the Fourier transform of the images displayed on spatial light modulator 106 onto storage medium 102. Fourier transform lens 108 is one focal length away from spatial light modulator 106 and storage medium 102.

The other light beam is a plane wave reference beam 110. The incidence angle of reference beam 110 onto storage medium 102 can be altered by a scanning mechanism 111. Reference beam 110 originates from a collimated beam 112 reflecting off a mirror 114 mounted on a rotation stage 116. The reflected collimated beam from mirror 114 is relayed to storage medium 102 by two lenses 118 and 120. Lenses 118 and 120 are separated by the sum of their focal lengths. The distance between mirror 114 and lens 118 is equal to the focal length of lens 118. The distance between storage medium 102 and lens 120 is equal to the focal length of lens 120.

The wavelength of reference beam 110 can be $\lambda_1$ 122 or $\lambda_2$ 124. $\lambda_1$ 122 is used for recording and $\lambda_2$ 124, which does not change the physical or chemical properties of storage medium 102, is used for reconstruction of holograms.

A reconstructed image beam 126 is captured by a 1-dimensional or 2-dimensional image or array detector 128. A Fourier transform lens 130 is positioned between and one focal length away from storage medium 102 and array detector 128.

The data displayed on spatial light modulator 106 comes from an electronic buffer memory, or page formatter 138. Data to be recorded in storage medium 102 are pre-formatted into appropriate pages. The necessity for pre-formatting will become clear in the "Operation of Invention" section.

Operation of Invention (embodiment I)

Holograms are recorded by exposing storage medium 102 to the interference pattern of image beam 104 and reference beam 110 at wavelength $\lambda_1$ (FIG. 1). Multiple holograms of different images displayed on spatial light modulator 106 are recorded by altering the incidence angle o reference beam 110 using scanning mechanism 111. Recording multiple holograms in a common volume of storage medium by using a reference beam of different incidence angles is generally known as angular multiplexing in the field of holographic storage.

Holograms are read out or reconstructed by illuminating storage medium 102 with reference beam 110 at wavelength $\lambda_2$. The information that is read out is determined by the incidence angle of the readout reference beam. The principle of operation of using a second wavelength to reconstruct holograms is explained in the following "Theory of Operation" section.

Theory of Operation

Figure 2A:
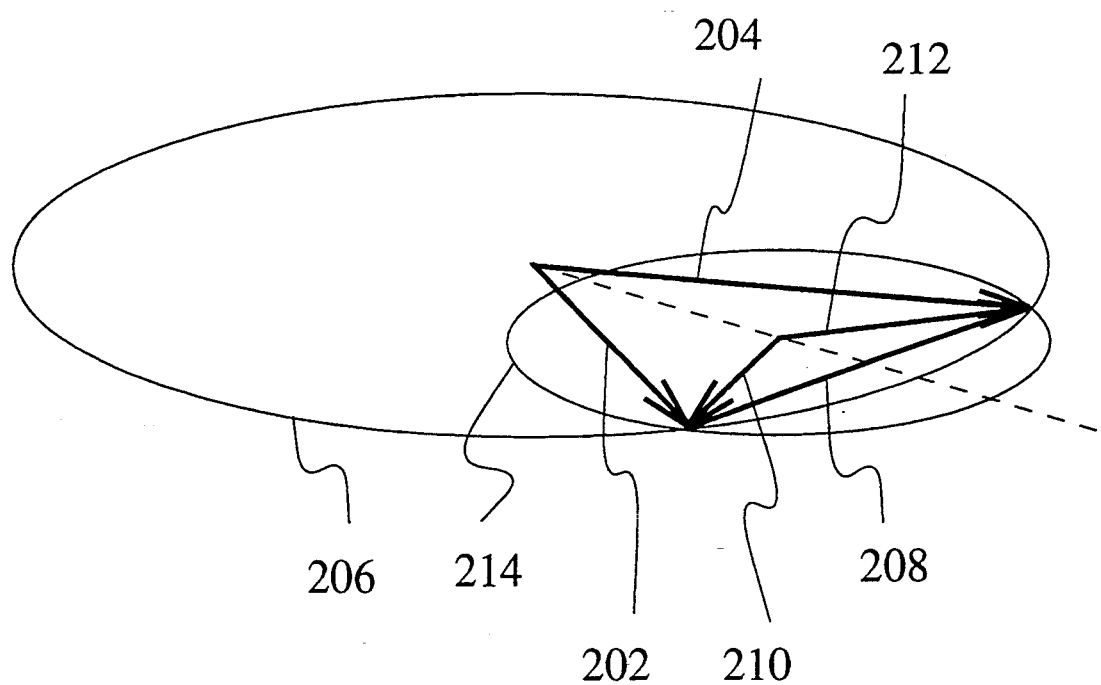
FIG. 2a shows the Bragg-matching conditions of using different wavelengths for recording and reconstruction.

Suppose that the hologram recorded by image beam 104 and reference beam 110 is recorded at a wavelength $\lambda_1$. Furthermore, suppose image beam 104 is also a plane wave. We can represent both image beam 104 and reference beam 110 by k-vectors 202 and 204 in FIG. 2A. (The orientation and length of a k-vector specifies the direction of propagation and the wavelength of the plane wave. Representing k-vectors of the same wavelength by the radii of a sphere is conventional.) The tips of k-vectors lie on the surface of a k-sphere 206. The center of k-sphere 206 is labeled as $O_1$. A vector 208 joining the tips of k-vectors 202 and 204 represents the hologram recorded. Suppose the hologram is reconstructed using a plane wave at $\lambda_2$, which is drawn in FIG. 2A as a k-vector 210. The reconstructed beam is represented by a k-vector 212. Both the tips of k-vectors 210 and 212 lie on the surface of a k-sphere 214 corresponding to wavelength $\lambda_2$. The center of k-sphere 214 is labeled as $O_2$. The reconstruction of hologram 208 is an efficient one because vectors 208, 210, and 212 are Bragg matched—a condition in which vectors 208, 210, and 212 form a complete tip-to-tip triangle.

Figure 2B:
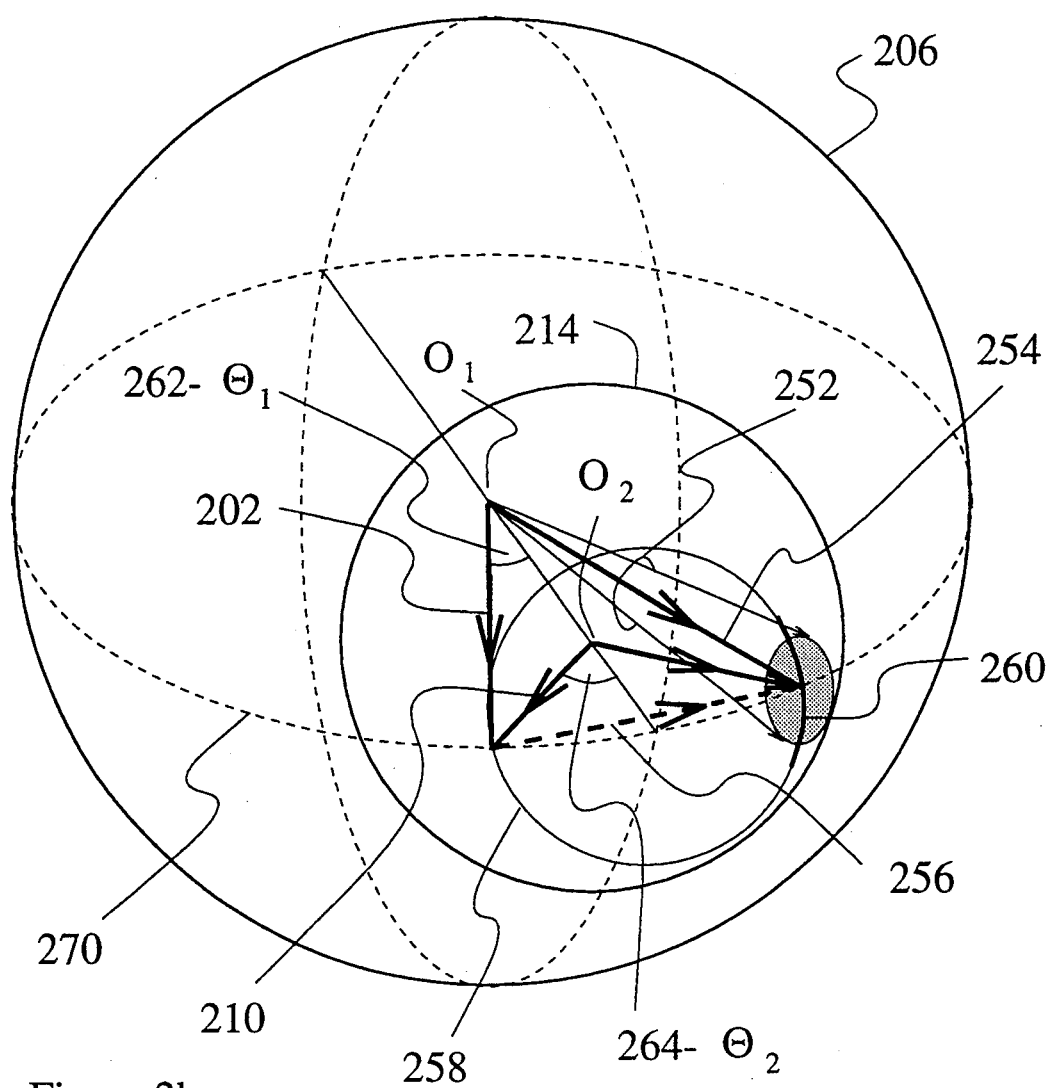
FIG. 2b shows the k-space diagram of the recording and reconstruction of holograms using two different wavelengths.

Reconstructing a complex image recorded at wavelength $\lambda_1$ using wavelength $\lambda_2$, however, is not straightforward. In k-space, the representation of a complex image is no longer a single vector but a cone of k-vectors 252(FIG. 2B)—each k-vector corresponding to a pixel on spatial light modulator 106. A k-vector 254 in FIG. 2B represents the nominal k-vector of cone 252. The recorded hologram consists of grating vectors connecting the tip of reference k-vector 202 to all the k-vectors of cone 252 on $\lambda_1$ sphere 206. Only a nominal grating vector 256 is shown in FIG. 2B. We would like the readout beam to be simultaneously Bragg matched to all the gratings so that the entire recorded hologram can be efficiently reconstructed by a $\lambda_2$ beam. This, however, is not possible. To understand what happens, consider k-spheres 206 and 214 in FIG. 2B. The intersection of the two spheres forms a circle 258. A grating recorded at $\lambda_1$ is Bragg matched to the $\lambda_2$ readout beam if its tip lies on circle 258. As shown in FIG. 2B, signal cone 252 intersects circle 258 only along an arc 260. This means that only those pixels on the display whose k-vectors fall on arc 260 are Bragg matched. In the paraxial approximation, arc 260 can be approximated by a line, implying that a vertical line of pixels on spatial light modulator 106 will be simultaneously Bragg matched. In other words, when the hologram is illuminated at $\lambda_2$, the reconstruction consists of only one line of the image recorded at $\lambda_1$. The position of the reconstructed line is related to $\lambda_1$ and $\lambda_2$ by equation (i):

$$\frac{\sin \theta_1}{\lambda_1} = \frac{\sin \theta_2}{\lambda_2}, \quad \text{(i)}$$

where $\theta_1$ 262 and $\theta_2$ 264 are defined in FIG. 2B.

Figure 3:
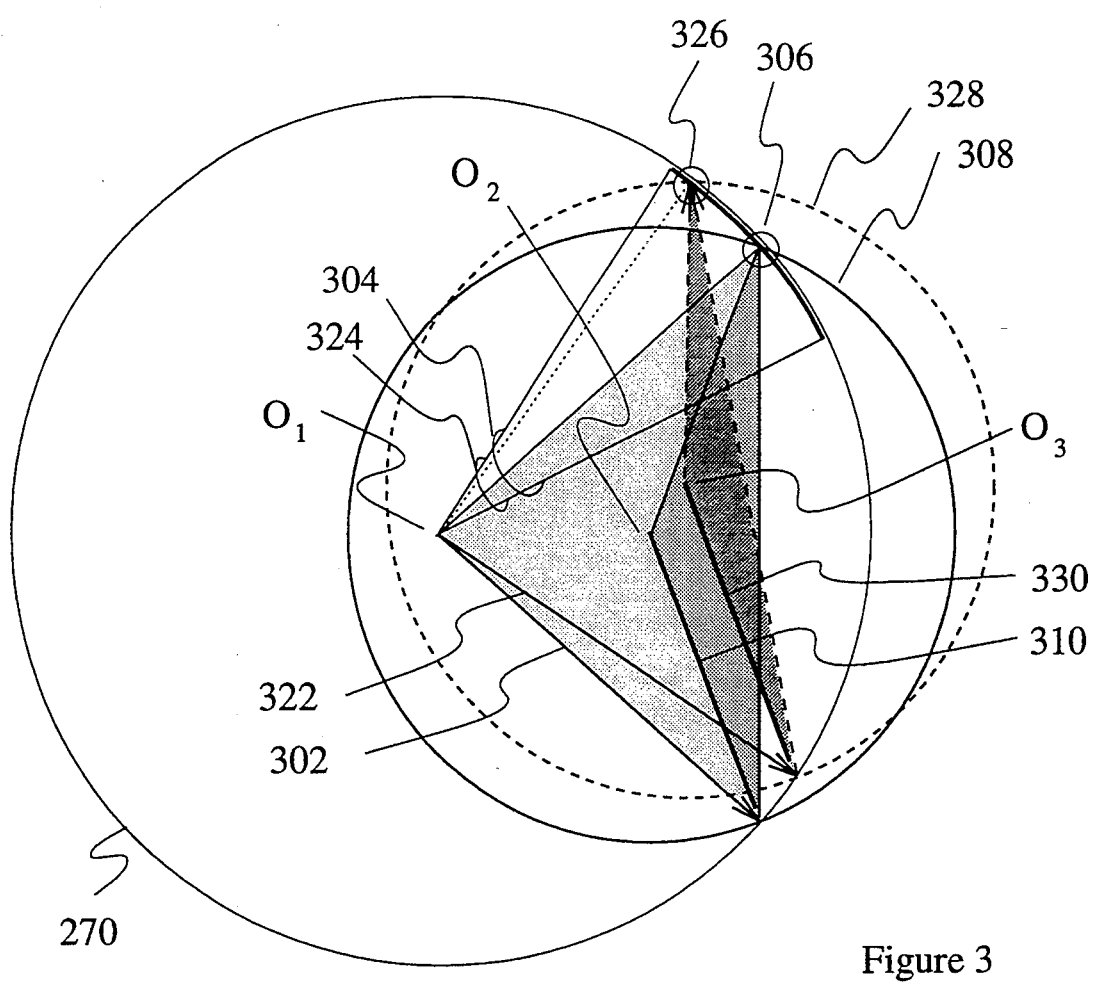
FIG. 3 shows the cross section of the k-space shown in FIG. 2 along the plane containing the k-vectors of the two reference beams.

Now suppose that instead of a single image, multiple images are recorded at wavelength $\lambda_1$ by angular multiplexing reference 110. Consider FIG. 3A. FIG. 3A is a planar cross-section, containing a circle 270, of FIG.

2B. For the example of two holograms, two reference k-vectors 302 and 322 are drawn. For each reference beam, there corresponds a different image beam. Two k-vector cones 304 and 324 represent the two image beams. Note that cones 304 and 324 occupy the same k-space. The grating vectors, which connect the tip of reference k-vectors 302 and 322 to the tips of all the k-vectors within cones 304 and 324, are not shown.

When the recorded holograms are illuminated with a plane wave at $\lambda_2$, a single line of each of the stored images is Bragg matched to the illuminating beam. The reconstructed lines of images are perpendicular to the planar cross section of FIG. 3A, and project onto points 306 and 326 in FIG. 3A. Points 306 and 326 have different positions because their Bragg matching conditions are different. For point 306, the Bragg matching condition is defined by the intersection of circle 270 and a circle 308 (centered at $O_2$), reconstructing beam represented by k-vector 310, and the angular relationship between-vector 310 and k-vector 302 of hologram #1. Likewise for point 326, the Bragg matching condition is defined by the intersection of circle 270 and a circle 328 (centered at $O_3$), reconstructing beam represented by a k-vector 330, and the angular relationship between k-vector 330 and k-vector 302 of hologram #2. Note that k-vectors 310 and 330 have the same orientation since they both represent the same reconstructing beam (positions of k-vectors are unimportant in k-space).

In cases of reconstructing multiple angularly multiplexed holograms, a single line of each of the stored images is Bragg matched to the illuminating beam. The angle of the $\lambda_2$ readout beam can be selected so that the complete reconstruction is a 2-dimensional image whose vertical lines belong to different stored images.

Changing the angle of the reconstructing beam selects different lines from each image. (Recall that the angular relationship between the reconstructing beam and the reference k-vectors of different holograms affects the Bragg matching conditions for different holograms.) As a result, a different image will be reconstructed.

Figure 4:
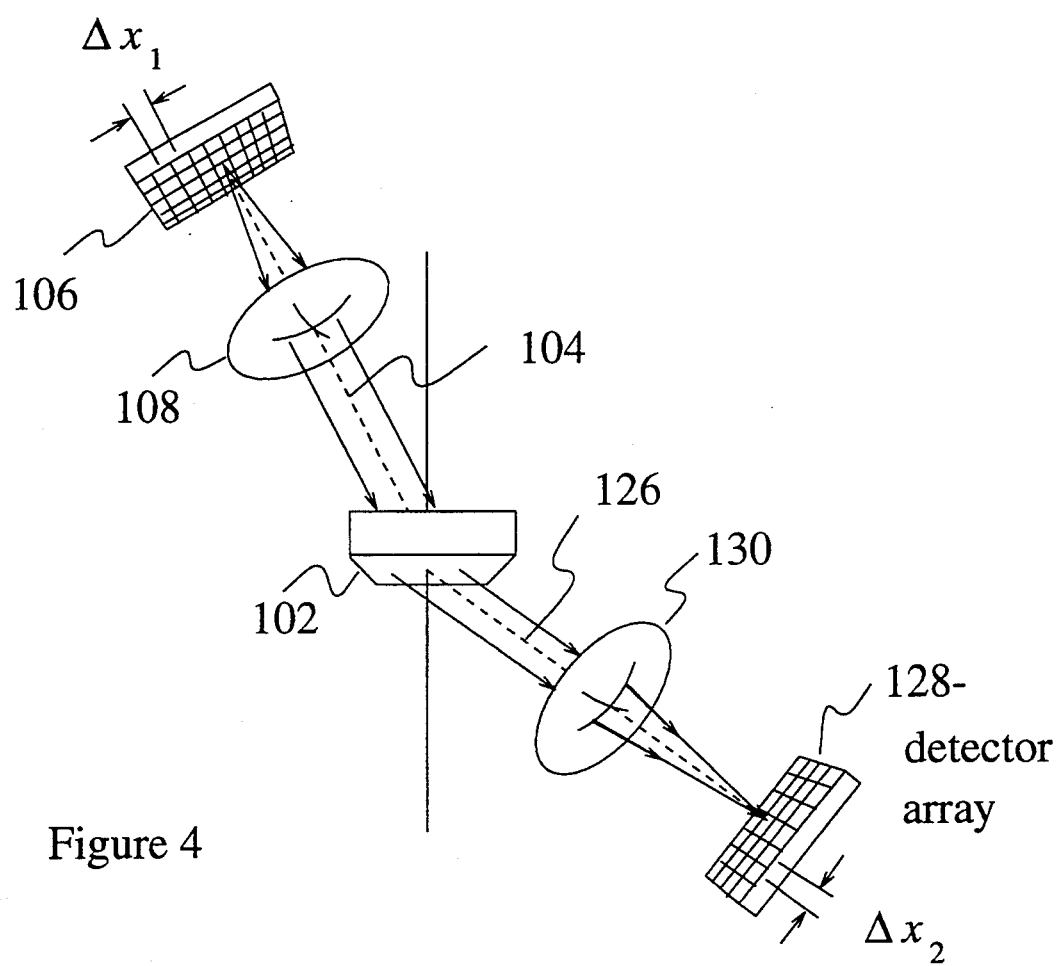
FIG. 4 shows part of the preferred embodiment shown in FIG. 1.

To ensure that the interleaving is properly done, the following relationship between pixel spacing of spatial light modulator 106, or $\Delta x$ 402, and reference beam angle separation, or $\Delta \theta$, must hold:

$$\Delta x = \frac{\sin(\theta_2 + \theta_1)}{\sin(\theta_2 - \theta_1)} F \Delta \theta, \quad \text{(ii)}$$

where F is the focal length of the Fourier transform lens 108 shown in FIG. 4.

Figure 5:
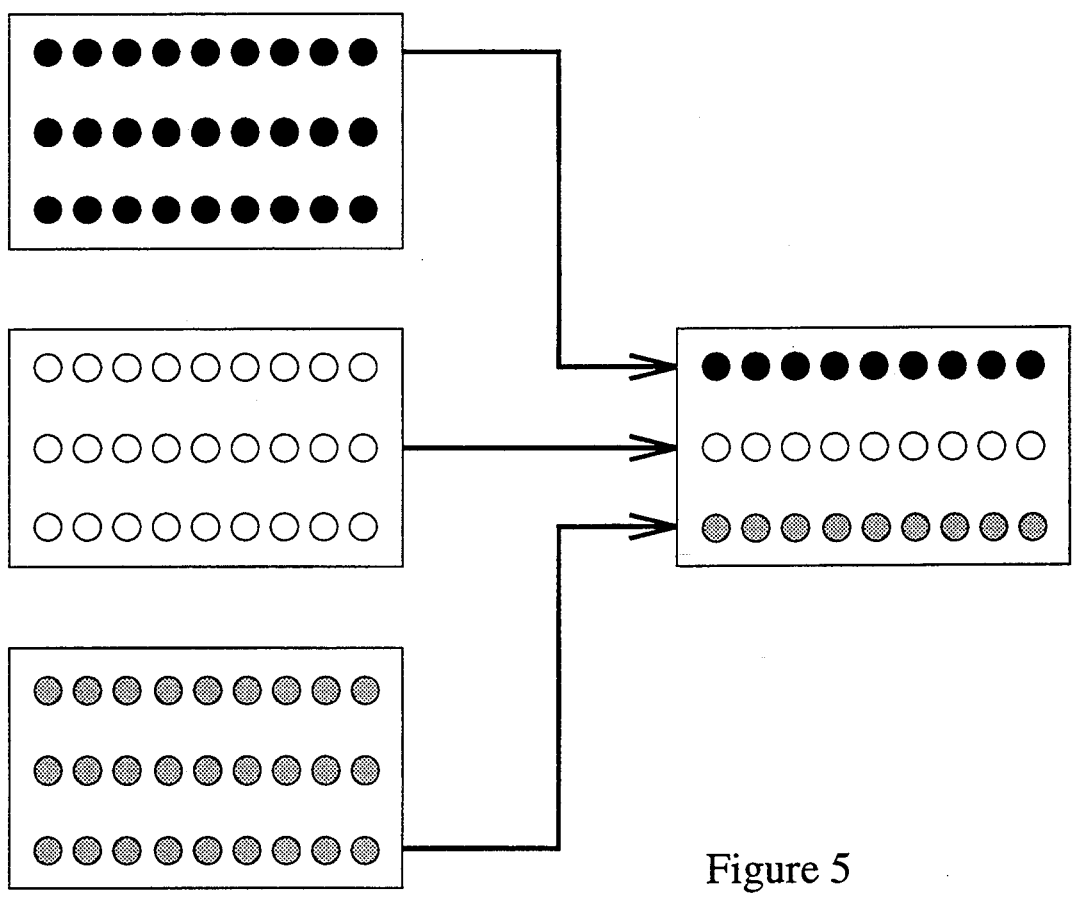
FIG. 5 shows an example of interleaving of lines from different images used for formatting the pages.

From the above, we conclude that an entire page of data can be reconstructed simultaneously at $\lambda_2$, even though the stored images and the retrieved images are not the same. However, since the transformation is a fixed and regular interleaving of the lines of data, we can organize the data properly so that upon retrieval its identity is unambiguous. For instance, suppose that we want to use this memory to directly store 2-dimensional images so that they can be retrieved intact. This can be accomplished by pre-formatting all the data of the images to be stored in a buffer. The pro-formatting interleaves the images so that the subsequent interleaving at the memory readout regroups the images properly. An example of interleaving 3 images is shown in FIG. 5.

Alternate Configurations of Embodiment I

Unlike that illustrated by FIG. 1, reference beam 110 and image beam 104 can illuminate storage medium 102 from different sides. Storage medium of any appropriate shape and dimensions can be used.

1-dimensional spatial light modulators, holograms, detectors can be used instead of 2-dimensional components. In such cases, the k-vector cones for the signal beams become k-vector lines. No pre-formatting of data, will be required.

Figure 6A:
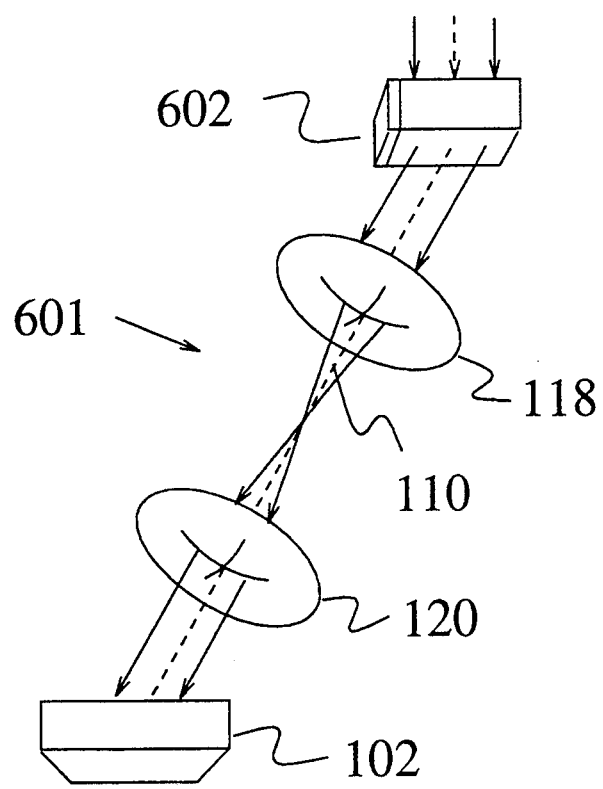
FIGS. 6a and 6b show alternate configurations of the scanning mechanism in the preferred embodiment shown in FIG. 1. The configuration in FIG. 6a uses an acoustooptic deflector, and that in FIG. 6b uses a translation stage.

Different scanning mechanisms can be used to change the incidence angle of reference beam 110. FIG. 6A shows one such example. Scanning mechanism 601 uses an acoustooptic scanner 602 instead of mirror 114 and rotation stage 116, as in scanning mechanism 111.

Figure 6B:
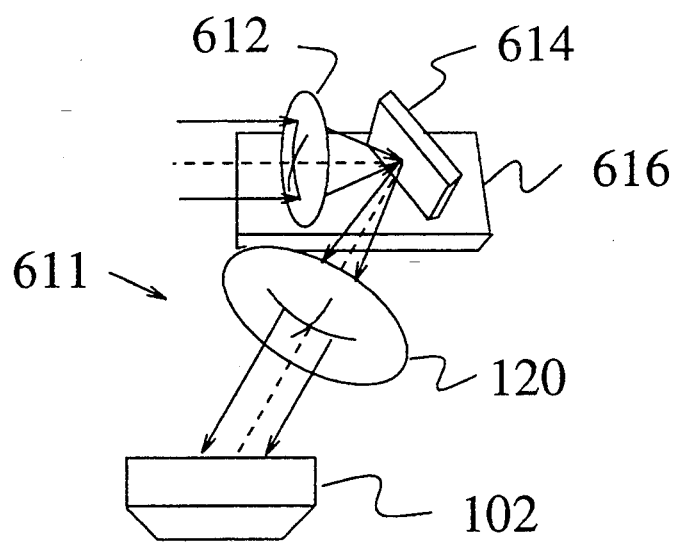

FIG. 6B shows another scanning mechanism 611. A lens 612 and a mirror 614 are mounted on a translation stage 216. The front focal plane of lens 612 coincides with the back focal plane of lens 120.

Figure 7A:
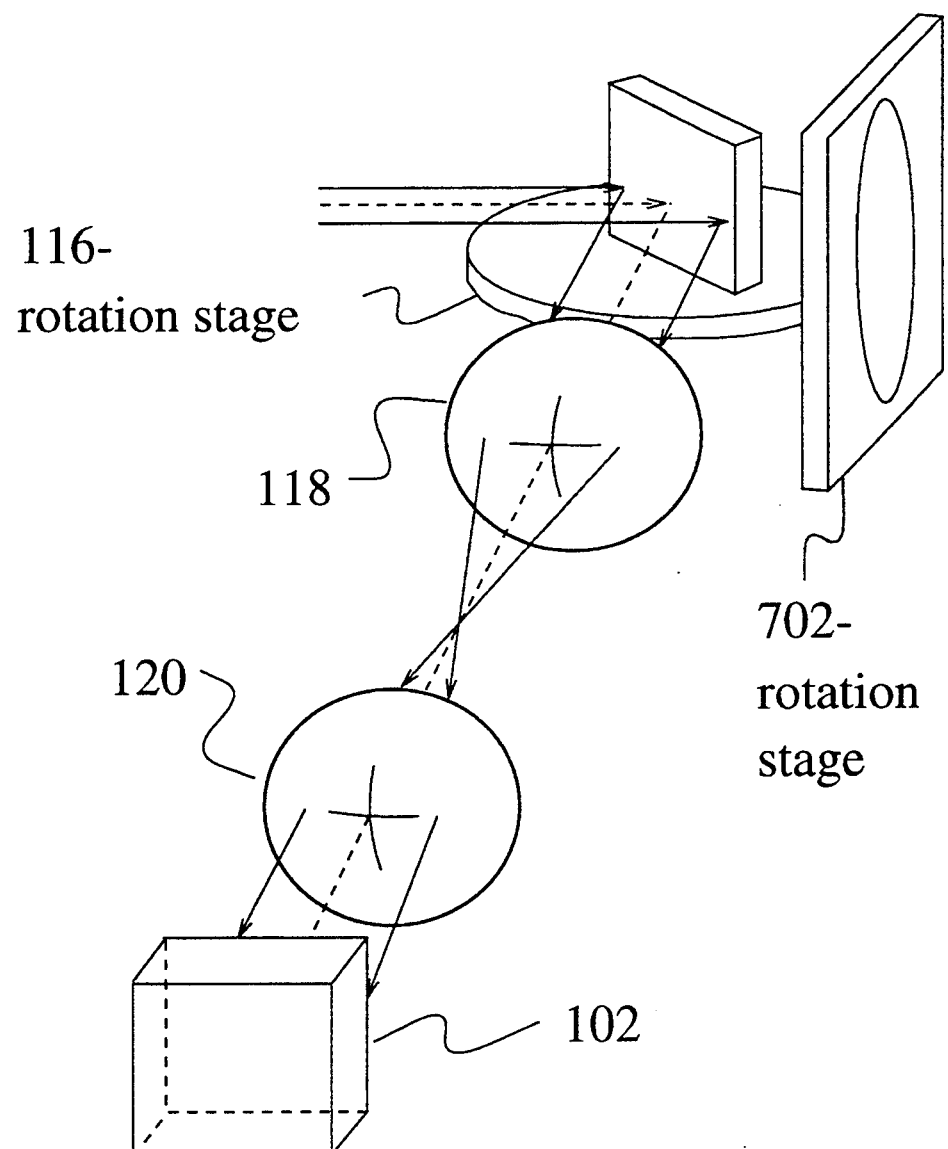
FIGS. 7a, 7b, and 7c, show configurations for the scanning mechanism to perform two dimensional angle scanning. The configuration in FIG. 7a uses two rotation stages; the configuration in FIG. 7b uses a two dimensional acoustooptic delfector, and the configuration in FIG. 7c, uses two translation stages.
Figure 7B:
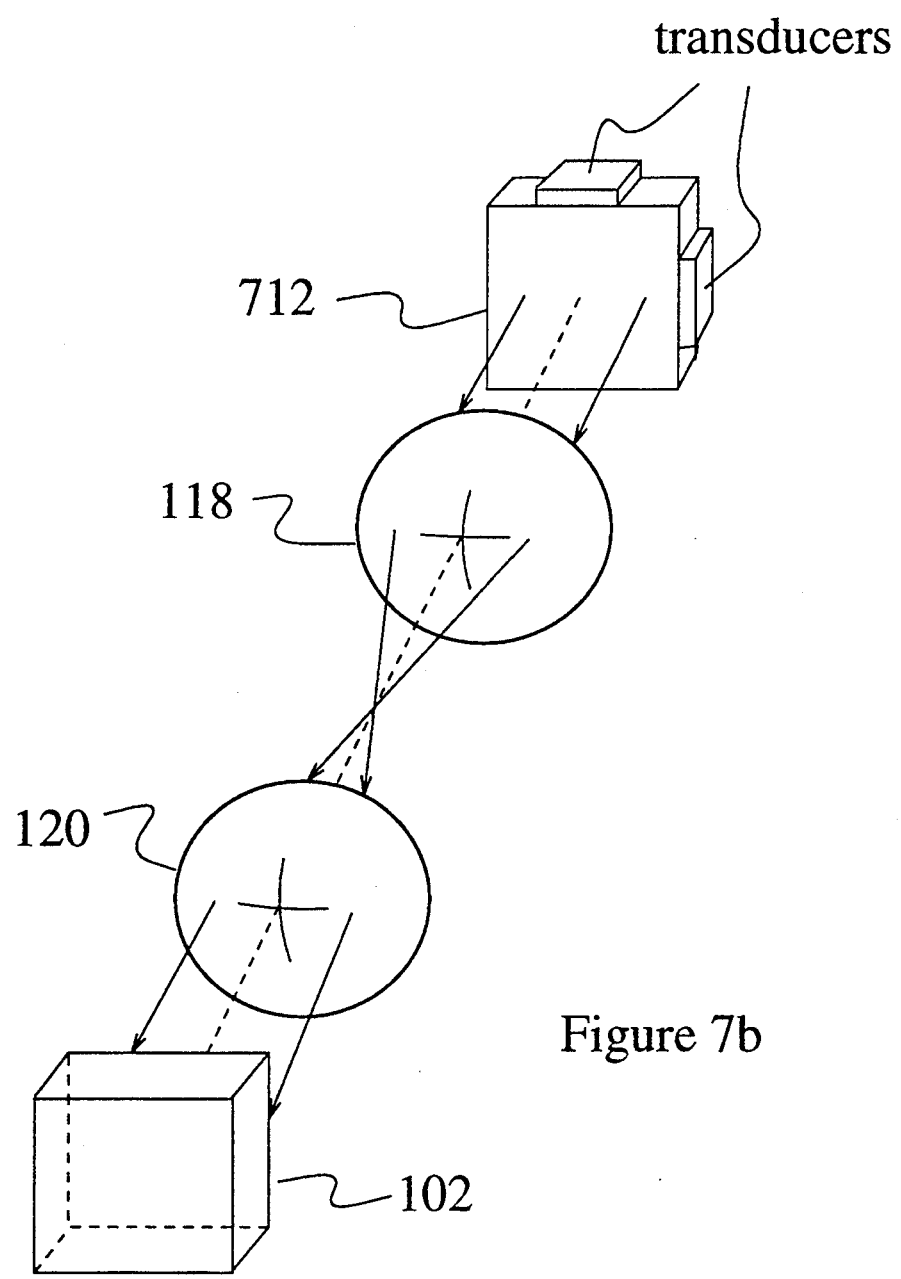
Figure 7C:
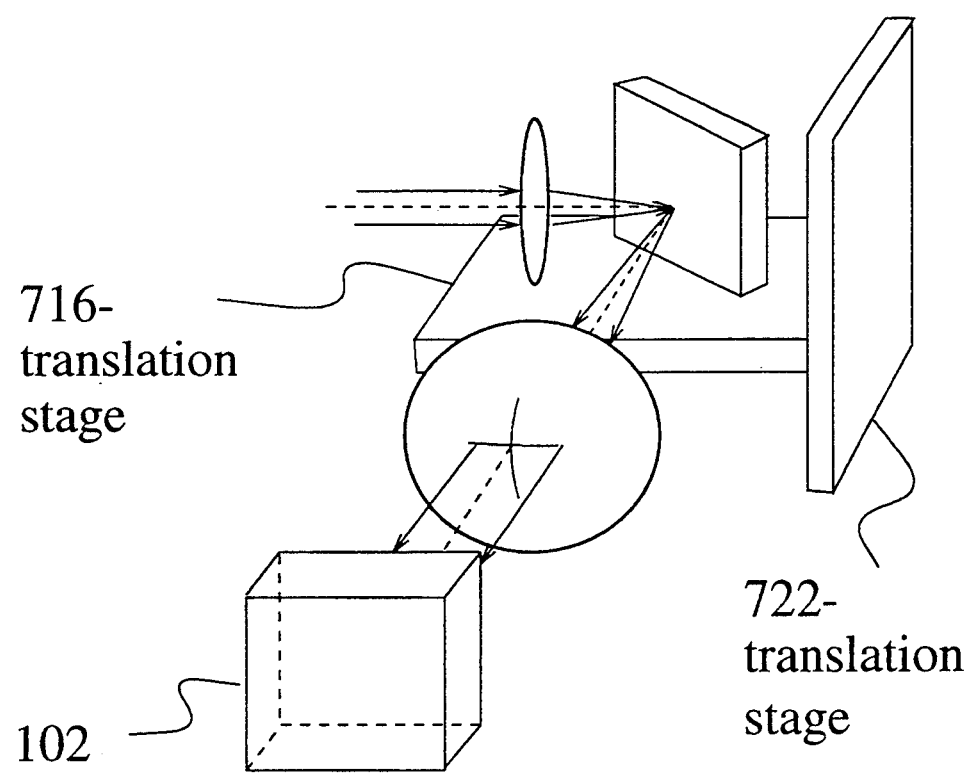

Two dimensional scanning is also possible. For example, rotation stage 116 is mounted on an orthogonally-mounted rotation stage 702 as shown in FIG. 7A. In FIG. 7B, a 2-dimensional acousto-optic scanner 712 is used. In FIG. 7C, translation stage 716 is mounted on an orthogonally-mounted translation stage 722.

Angular multiplexing can also be implemented by changing the orientation of storage medium 102.

Figure 8:
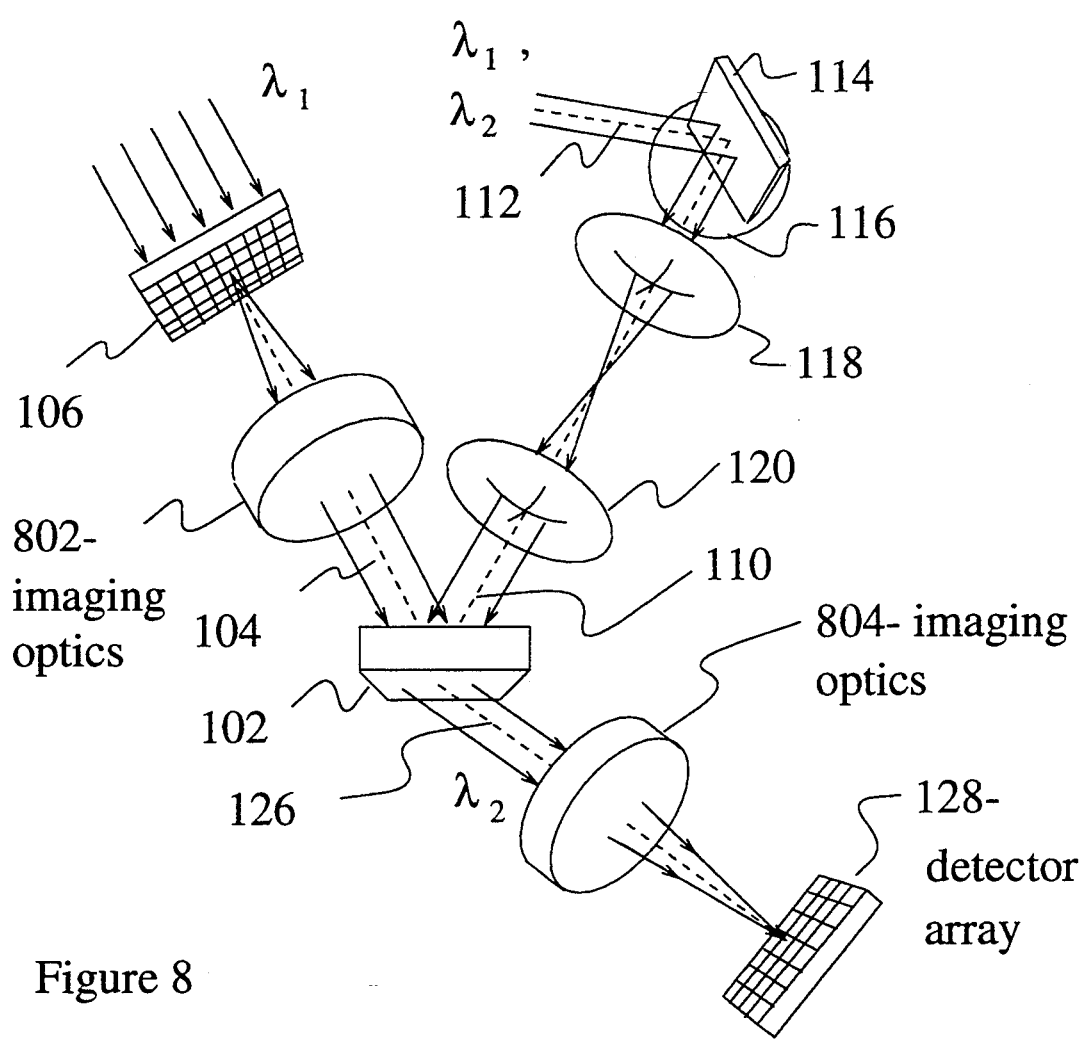
FIG. 8 shows part of the preferred embodiment shown in FIG. 1 using imaging optics instead of Fourier transform lenses.

Imaging optics can be used instead of Fourier transform optics in image beam 104 and reconstructed image beam 126. In FIG. 8, imaging optics 802 and 804 with suitable magnification power and positioned properly in image beam 104 and reconstructed image beam 126 are used.

Figure 9:
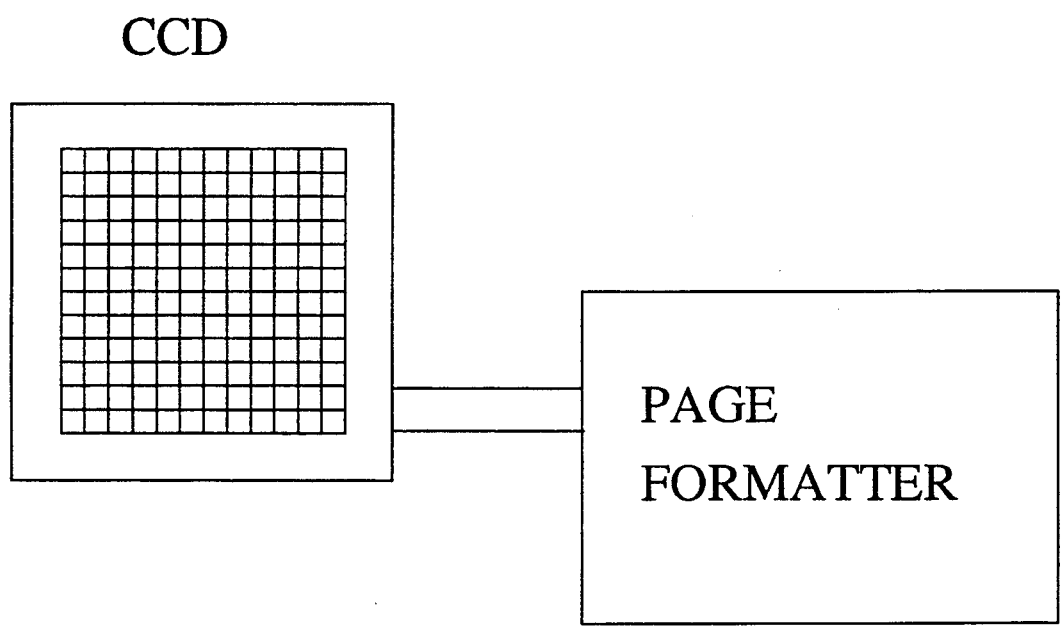
FIG. 9 shows the detector array with the page formatter.

The reconstructed image data can be interpreted at the readout end. FIG. 9 shows such a configuration. An output image buffer 902 allows proper arrangement of data for electronic interface. Alternatively, only one line of image data is read out every time an image is reconstructed. In this case, the electronic data for the desired image is retrieved after many images are reconstructed. No buffers will be needed at the expense of a slower data output transfer rate. Different data formats and buffer configurations yield compromises in the middle.

Combinations of scanning mechanisms, optics, and formatting can be used where appropriate.

Preferred Embodiment II

Figure 10:
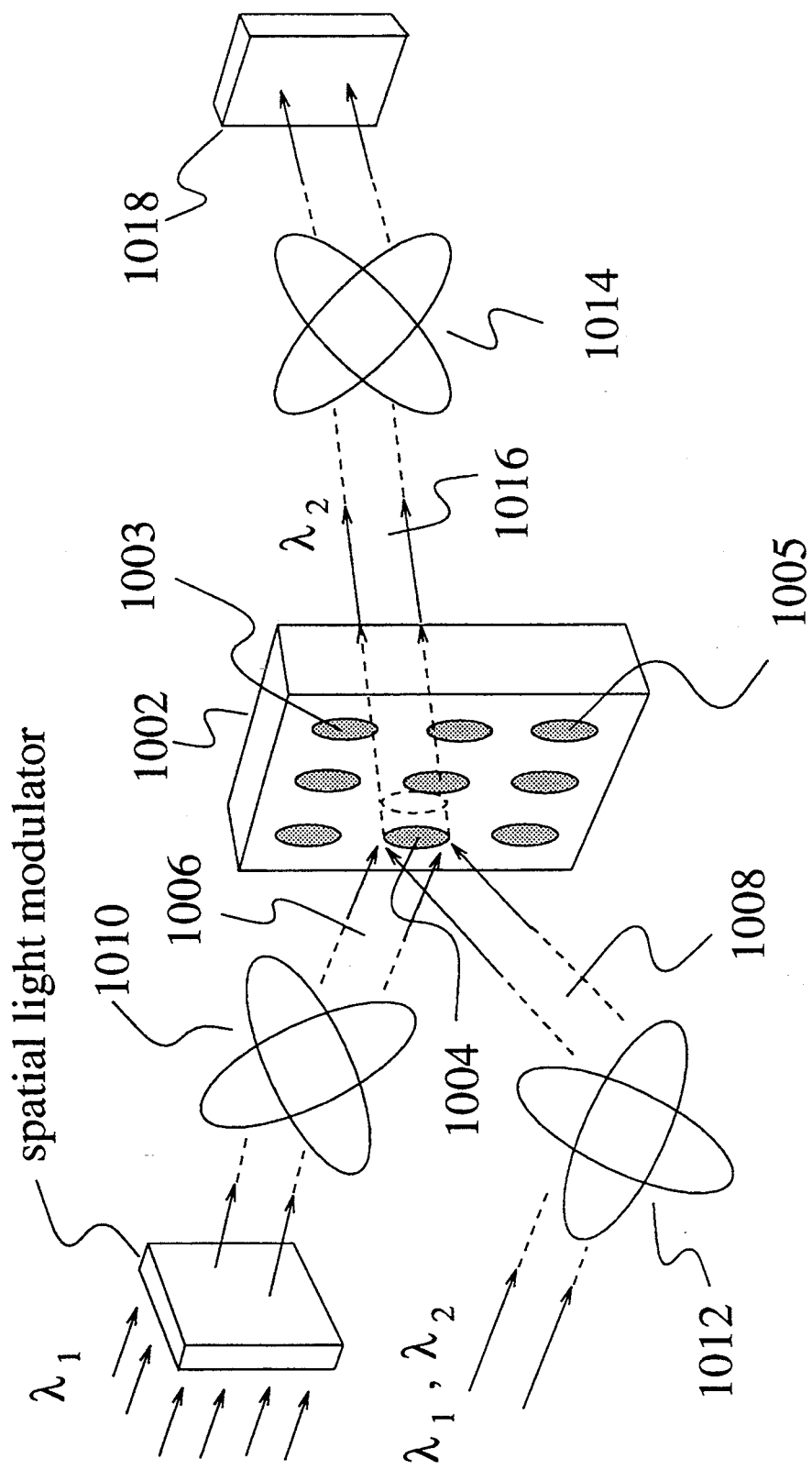
FIG. 10 shows the generic configuration for recording and reconstructing holograms at several locations with beam steering and scanning mechanisms.

FIG. 10 shows a perspective view of preferred embodiment II. A volume of sufficiently large photosensitive material 1002 is the holographic storage medium. Holograms are recorded in a multiple number of locations. Three such locations 1003, 1004, and 1005, symbolized by circles, are shown in FIG. 10.

An image beam 1006 and a reference beam 1008 at wavelength $\lambda_1$ provide the energy for recording holograms. At each location, say 1004, angle-multiplexed holograms are recorded using mechanisms similar to those described in Embodiment I. Beam steering mechanism 1010, and 1012 (only symbols for generic steering mechanisms are shown, reasons to be explained) is used to direct image beam 1006, and reference beam 1008 to different locations within storage medium 1002. Both beams 1006 and 1008 illuminate the same locations during recording of holograms. In addition, steering mechanism 1012 for reference beam 1008 will also alter the angle of incidence of reference beam 1008 to angularly multiplex holograms.

Illuminating location 1004 with reference beam 1008 at wavelength $\lambda_2$ reconstructs the holograms stored within location 1004. Scanning mechanism 1012 directs reference beam 1008 to location 1004 at appropriate incidence angles as explained in Embodiment I. Each complete reconstructed image contains lines of partial images belonging to different stored images. Steering mechanism 1014 directs reconstructed image beam 1016 to a detector array 1018. Again, a symbol for a generic steering mechanism is shown in FIG. 10.

Any appropriate combinations of mechanical or electrooptic steering mechanism can be used in this embodiment. These scanning mechanisms are apparent to the skilled in the art of steering mechanisms. The said scanning mechanisms will not be further described in the present specification. A description of an example of such a scanning mechanism can be found in the paper "Spatially- and Angle-multiplexed Holographic Random Access Memory" written by Fai Mok, Demetri psaltis, and Geoffrey Burr, and published in SPIE Proceedings, volume 1773, pp. 334–345, 1992. The above reference is incorporated by reference into the specification. (A copy of the paper is enclosed with this patent application.)

Description of Embodiment III

Figure 11:
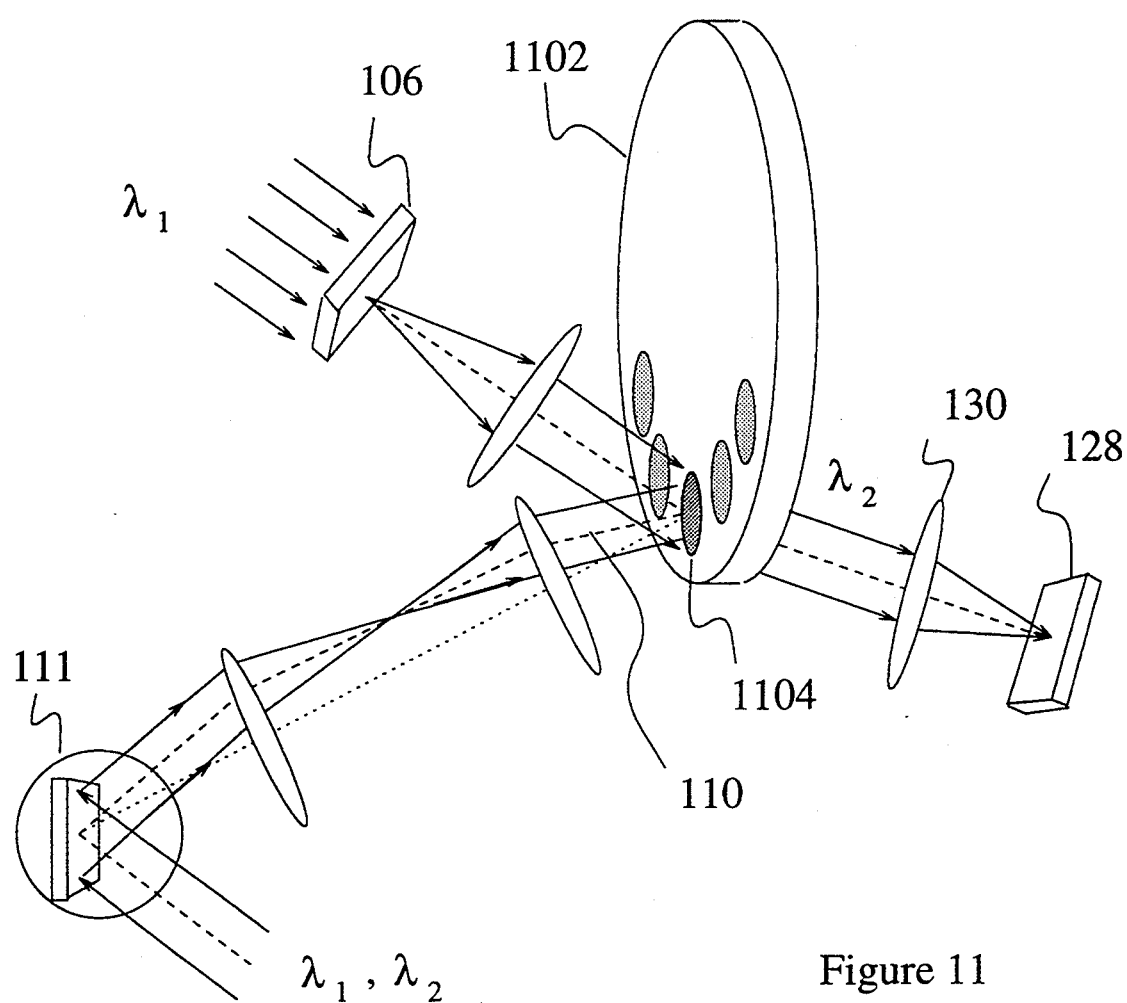
FIG. 11 shows the implementation of the system shown in FIG. 10 using the 3-D disk.

Embodiment I can be incorporated into a 3-dimension disk system as shown in FIG. 11. The recording medium is shaped as a disk 1102. Images or pages of information or data are recorded at different locations 1104 on the disk. Multiple pages of data are superimposed at each location 1104. Each page of data is displayed on spatial light modulator 106, and a Fourier transform hologram of the data is written on the disk by interfering it with reference beam 110 at wavelength $\lambda_1$. Multiple pages of data are superimposed at the same location by changing the incidence angle of reference beam 110. The incidence angle of reference beam 110 is changed by scanning mechanism 111 or other scanning mechanisms described in Embodiment I.

To store pages of data at different locations, the disk rotates to illuminate areas at different azimuth positions on the disk. The recording head consisting of scanning mechanism 111, spatial light, modulator 106, and lens 108, and is mechanically translated in the radial direction to access different radial locations. The thickness of the disk is determined by the number of pages of data to be recorded.

Once the data is recorded, any one of the stored pages can be retrieved by rotating the disk and positioning the readout head (consisting of scanning mechanism 111, array detector 128 and lens 130) to the proper location with the illumination at wavelength A2. The incidence angle of reference beam 110 is selected using scanning mechanism 111 to retrieve the proper page of data.

The incidence angle of reference beam 110 and pixel pitch $\Delta x$ of array detector 128 are determined according to equations (i) and (ii). Again, any appropriate scanning mechanism, optics, spatial light modulators, array detectors, and data formatter can be used.

The present invention is applicable to holographic memories that record with one wavelength and read out with another. Non-destructive readout of holograms can be accomplished using this invention. No different optics for readout than for recording are required. No loss in light efficiency will result. Since fixing of holograms is optional, flexibility of memory usage is thereby maintained. Recording media can be chosen to maximize recording speed without concern of over-absorbing during readout.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims:

We claim:

1. A method of reading-out data from a plurality of volume holograms, said method comprising;

storing a plurality of holograms in an optical recording medium, said optical recording medium of a predetermined shape and dimensions sufficient for supporting volume holography, said holograms being formed by optically exposing said optical recording medium to interference patterns of an image beam and a reference beam, respective incidence angles of said reference beam relative to said optical recording medium being between a first set of angles, said image beam including information from a first set of images including at least first and second images, said reference beam and said image beam being coherent light beams of a first wavelength;

obtaining a regenerating beam of a wavelength substantially different from said first wavelength;

illuminating said holograms with said regenerating beam using respective incidence angles relative to said recording medium which are substantially different from said first set of angles, said regenerating beam having characteristics to regenerate a second set of images, images of said second set having parts which are shuffled relative to said first set of images, said second set of images including a first regenerated image that includes at least a part of said first image and a part of said second image;

reading out desired information based on said second set of images; and formatting one of said sets of images so that said desired data which is read based on said second set of images is in a desired format.

2. The method of claim 1 wherein each line of each said second set of images belongs to a distinct image selected from said first set of images.

3. The method of claim 1 wherein said storage medium is sufficiently large to support volume holograms in a plurality of substantially distinct locations; and further comprising accessing said regenerated information from said locations.

4. The method of claim 2 wherein further comprising (a) said storage medium is sufficiently large to support volume holograms in a plurality of substantially distinct locations; and accessing said regenerated information from said locations.

5. The method of claim 3 wherein said storage medium is shaped like a disk of sufficient thickness for supporting volume holography.

6. The method of claim 4 wherein said storage medium is shaped like a disk of sufficient thickness for supporting volume holography.

7. A method as in claim 1 wherein said formatting step comprises a reconstruction page including only one line of one image at a position related to a recording wavelength λ1 and a readout wavelength λ2 according to $$\sin \frac{\theta_1}{\lambda_1} = \sin \frac{\theta_2}{\lambda_2}$$

where $\theta_1$, and $\theta_2$ are angles of respective Bragg triangles.

8. A hologram recording and reproducing device, comprising:

a hologram recording element, including an element which stores a plurality of holograms in an optical recording medium of appropriate shape and dimensions, said hologram recording element including elements which optically expose said optical recording medium to interference patterns between an image beam and a reference beam which intersect said medium at respective incidence angles within a first set of angles, said image beam including information from a first set of images that includes at least first and second images;

a beam producing element which produces a regenerating beam having a wavelength substantially different than the first wavelength;

optical elements which illuminate said hologram recording element with said regenerating beam, using incidence angles which are different than said first set of angles to regenerate a second set of images, said second set of images being shuffled relative to said first set of images, such that at least one regenerated image of said second set of images includes a portion of said first image and a portion of said second image;

an image information reading device, producing output information from said second set of images; and an image page formatter, operating to format one of said first and second set of images such that said output information includes only information from a desired image.

* * * * *